Aug. 8, 1967 HUNG CHANG LIN 3,335,341

DIODE STRUCTURE IN SEMICONDUCTOR INTEGRATED CIRCUIT AND METHOD OF MAKING THE SAME

Filed March 6, 1964 2 Sheets-Sheet 1

WITNESSES:
John L. Chopp
James F. Young

INVENTOR
Hung C. Lin
BY Gordon H Telfer
ATTORNEY

United States Patent Office 3,335,341

Patented Aug. 8, 1967

3,335,341

DIODE STRUCTURE IN SEMICONDUCTOR INTEGRATED CIRCUIT AND METHOD OF MAKING THE SAME

Hung Chang Lin, Silver Spring, Md., assignor to Westinghouse Electric Corporation, Pittsburgh, Pa., a corporation of Pennsylvania Filed Mar. 6, 1964, Ser. No. 349,868
4 Claims. (Cl. 317—235)

This invention relates generally to semi-conductor diodes and, more particularly, to semiconductor diode structures in integrated circuits that also include at least a transistor structure.

Integrated circuit fabrication by one present technique is carried out using a substrate of one conductivity type, p-type, for example, with a layer of opposite, n-type, material grown thereon by epitaxial growth. Isolation walls are formed by diffusion of a p-type impurity through the epitaxial layer to the substrate. The isolation walls and substrate isolate portions of the epitaxial layer by the p-n junctions formed therewith. Within each of the isolated portions of the epitaxial layer are formed, by selective diffusion operations through oxide masks, regions to provide structures for performing functions of electronic components such as transistors, diodes, capacitors and resistors.

It is conventional in such integrated circuits to form structures for transistor and diode structures by the same diffusion steps. For example, a p-type impurity is simultaneously diffused into one portion of the epitaxial layer for the transistor base and into another portion for the diode anode. An n-type impurity is then diffused for the transistor emitter and diode cathode. As a consequence of forming the diode by double diffusion, the breakdown voltage of the diode junction is relatively low, typically less than about 15 volts, which limits its usefulness.

Additionally, the diffusion operations in which the diode and transistor structures are formed are necessarily performed so that the resulting transistor structure has good current gain. This means that the width of the base region, between the emitter junction and the collector junction, is relatively small. Consequently the anode region in simultaneously formed diode structures is also thin. With a forward bias on the diode there may be transistor action in the diode structure with considerable loss of current.

For most effective isolation of the different elemental portions of an integrated circuit, the n-type epitaxial layer underlying a diode structure is in some instances connected to a positive potential to maintain the junction with the substrate in a reverse bias. This is frequently done where there is not a suitable negative potential available to be applied to the p-type substrate itself. For example, in some circuits, the signal voltage may be more negative than the negative supply voltage. In such instances, when the n-type epitaxial layer is maintained at a positive potential, transistor action is facilitated in the diode structure. Prior suggestions to avoid transistor action, such as having the anode contact short the junction with the n-type layer below, still do not provide a high breakdown voltage. Furthermore, the junction between the diffused p-type layer and the n-type layer below, even though it has a relatively high breakdown voltage, cannot be used as the diode junction since isolation from the substrate cannot be as readily preserved.

It is also the case that any redesign of the diode structure in order to improve both the breakdown voltage and to avoid transistor action must be such that the ability to fabricate high gain transistor structures in the same integrated circuit is preserved.

It is, therefore, an object of the present invention to provide an improved diode structure suitable for incorporating with a transistor structure in an integrated circuit with the diode structure having a high breakdown voltage and being effectively isolated from the substrate.

Another object is to provide a method of fabricating such improved diode structures with transistor structures in integrated circuits that requires little additional processing compared with that conventionally employed and does not hinder the ability to fabricate high gain transistor structures.

The invention, in brief, achieves the above-mentioned and additional objects and advantages by providing a diode structure in an integrated circuit having a relatively thick region of one semiconductivity type, for example p-type, that underlies and encloses an n-type region that is part of the conventionally employed n-type epitaxial layer. The thick region, greater than a carrier diffusion length in thickness between the junctions, substantially prevents transistor action from occurring in the diode structure. Since the enclosed n-type region is a region with a relatively low impurity concentration, i.e., lower than that of transistor emitter regions, the breakdown voltage of the diode is relatively high.

In accordance with the method of this invention, a p-type impurity deposition is made in the diode area between the growth of two separate n-type epitaxial layers. On the top surface of the second n-type layer a ring-like p-type deposition is made. This deposition may be made at the same time as that for a transistor base region. Upon redistribution of impurities, the p-type impurities diffuse through the n-type layer in the diode structure to form a p-type pocket enclosing part of the n-type epitaxial layer. The redistribution of impurities can be, and preferably is, performed in the same heating operation as that for the redistribution of impurities in the base regions of transistor structures so that the fabrication process is not greatly lengthened or complicated over that presently necessary.

The present invention together with the above-mentioned and additional objects and advantages thereof, will be better understood by referring to the following description taken in connection with the accompanying drawing wherein.

Figure 1:
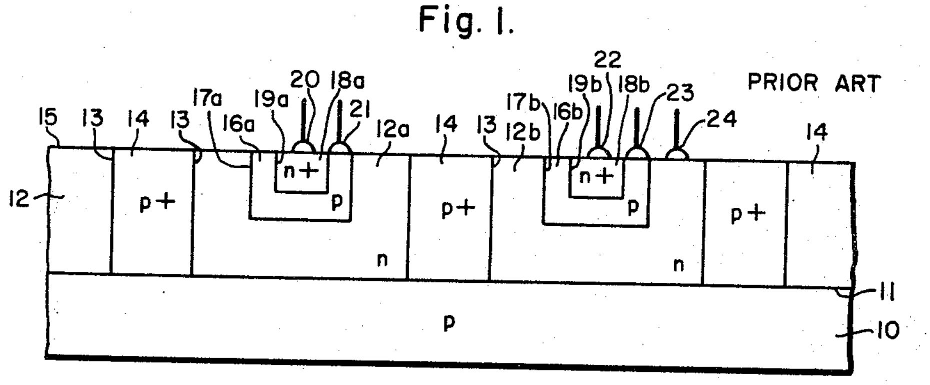
FIGURE 1 is a cross-sectional view of a portion of an integrated circuit in accordance with the prior art.

In the drawing only partial integrated circuits are illustrated inasmuch as the structures shown may be incorporated with additional elemental structures for the performance of the functions of other electronic components. It will also be noted that the dimensions in the drawing are greatly exaggerated, particularly in the thickness direction, for clarity in illustration.

While the invention is shown and described in connection with structures wherein the regions are designated as being of a particular type of semiconductivity, it will be understood that structures in which the semiconductivity type of the various regions is reversed from that shown may also be formed in accordance with this invention.

Referring now to FIGURE 1, a structure in accordance with the prior art is illustrated. The structure comprises a p-type substrate 10 having an n-type layer 12 thereon. Isolation walls 14 are diffused through the n-type layer 12 from the surface 15 to the substrate 10 and are of the same semiconductivity type as the substrate. Consequently isolated portions 12*a* and 12*b* of the n-type layer 12 are formed being isolated by the p-n junctions 11 and 13 formed with the substrate 10 and isolation walls 14, respectively. By the simultaneous diffusion of a p-type impurity into each of the isolated n-type regions 12*a* and 12*b*, the p-type regions 16*a* and 16*b* are formed with each having the same depth of penetration within the n-type material at junctions 17*a* and 17*b*, respectively. Additionally, n-type regions 18*a* and 18*b* are formed by selective diffusion into the major surface 15 of the p-type regions 16*a* and 16*b*, respectively, and form junctions 19*a* and 19*b*, respectively.

The two regions 18*a* and 16*a* provide a p-n junction diode having p-n junction 19*a* therein. Ohmic contacts 20 and 21, with associated leads, are applied to the regions 18*a* and 16*a*, respectively, for electrical connection thereto. The regions 18*b*, 16*b* and 12*b* cooperate to form a transistor and have contacts and leads 22, 23 and 24, respectively, in ohmic contact thereon.

The diffusion steps forming the like structures 12*a*–16*a*–18*a* and 12*b*–16*b*–18*b* are primarily dictated by transistor requirements, such as gain. However, an optimum transistor structure does not provide optimum diode performance.

In such a structure, the diode junction 19*a*, by reason of the double diffusion process by which it is formed, necessarily has a relatively low breakdown voltage that is undesirable for many circuit applications.

Additionally, the diode anode region 16*a* is a relatively thin region by reason of its being made identically to the transistor base region 16*b* and hence it is possible, when the diode is forward biased, for carriers injected across the junction 19*a* to reach the junction 17*a* that the anode region forms with the n-type layer 12*a*. This results in loss of current in the diode structure. Furthermore, if the integrated circuit is employed in an application where the n-type layer 12 is throughout maintained at a positive potential, then the transistor action of the diode structure is even more pronounced and undesirable. For this purpose an additional ohmic contact, not shown, would be disposed on the n-type region 12*a*.

Figure 2:
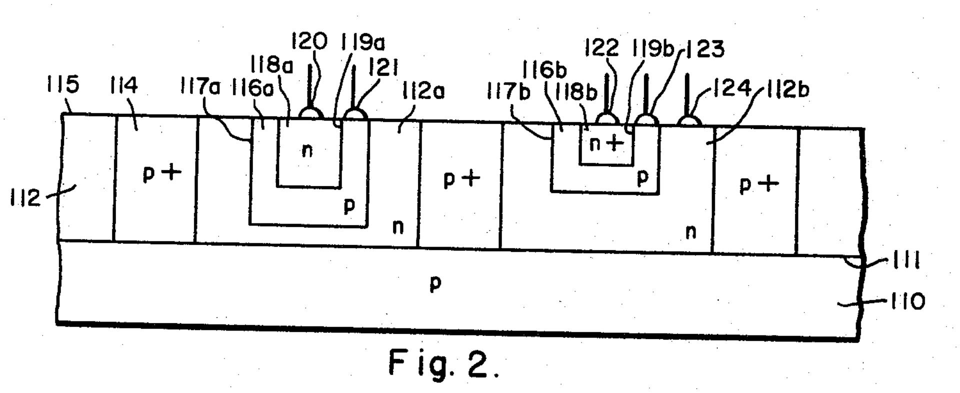
FIG. 2 is a cross-sectional view of a portion of an integrated circuit in accordance with the present invention.

Referring now to FIG. 2, a structure in accordance with this invention is illustrated wherein the individual elements corresponding to those shown in FIGURE 1 are designated by reference numerals having the same last two digits. In the diode structure, the anode region 116*a* penetrates considerably further within the n-type region 112*a* than does the base region in the transistor structure 116*b* within the n-type region 112*b*. Furthermore, instead of the cathode region 118*a* being formed by diffusion it is an enclosed portion of the original material of n-type region 112*a* so it has a relatively low impurity concentration, compared with that of the transistor emitter 118*b*, resulting in a higher breakdown voltage. The diode junction 119*a* is now at about the same depth, and has about the same breakdown characteristic, as the base-collector junction 117*b*. The thickness between the junctions 117*a* and 119*a* is at least greater than a carrier diffusion length and consequently transistor action within the diode structure is greatly minimized. The structure in the transistor portion of the device is substantially like that in the prior art structure.

In devices according to the prior art, the n-type layer 12 need not be a single, homogeneous epitaxial layer but may have a graded resistivity such as by first depositing a highly doped n+ layer and then a lower doped n-type layer thereon to provide advantages of reduced saturation resistance in transistor structures in the integrated circuit. Reference should be made to copending application Ser. No. 193,452, filed May 9, 1962, by H. C. Lin and assigned to the assignee of the present invention, now Patent 3,236,701, Feb. 22, 1966, for further information on the type of structure referred to. Such a graded resistivity for collector regions in transistor structures may also be provided in structures in accordance with this invention. For example, in FIG. 2 the epitaxial layer grown before the deposition of the impurity for the diode region 116*a* could be of a lower resistivity than the subsequent epitaxially grown layer.

In the transistor portion of the illustrated structures there is not shown an n+ region that is ordinarily formed within the region 12*b* or 112*b* to permit forming a good ohmic contact to the transistor collector region. Also omitted from FIGURES 1 and 2 is the passivating layer, ordinarily an oxide such as silicon dioxide, that extends over the major surface 15 or 115 of the device to protect the junctions. The passivating layer would have openings therein for the deposition of the ohmic contacts.

In addition to the contacts and leads illustrated, another contact disposed on the region 112*a* in the diode structure may be provided for the application of a positive potential to reverse bias the junction with the substrate.

In devices in accordance with this invention, the diode region 116*a* is greater than a carrier diffusion length in thickness so as to minimize transistor action. By a diffusion length is meant the average path length a carrier may travel through the semiconductive material. For the purposes of the present invention the thickness of the region 116*a* may suitably be in the range from about 10 microns to about 20 microns.

The relatively low impurity concentration of the diode cathode region 118*a* helps provide a relatively high breakdown voltage in the diode structure. The breakdown voltage is improved over that in the prior art structure so long as the enclosed epitaxial material of region 118*a* is less highly doped than the emitter 118*b* in the transistor structure. The emitter 118*b* typically has a surface impurity concentration in the range from about $10^{20}$ to about $10^{22}$ atoms per cubic centimeter while the diode region 118*a* suitably has an impurity concentration in the range from about $10^{14}$ to about $10^{16}$ atoms per cubic centimeter.

An n+ region, not shown, may be diffused in the diode region 118*a* to facilitate making a good ohmic contact thereto. Such a region would not extend to the junction 119*a* and would not affect the breakdown voltage.

Figure 3:
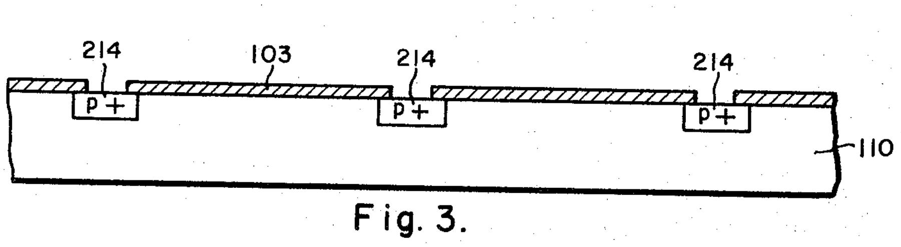
FIGS. 3, 4 and 5 are cross-sectional views illustrating the steps performed to produce a structure like that shown in FIG. 2.
Figure 4:
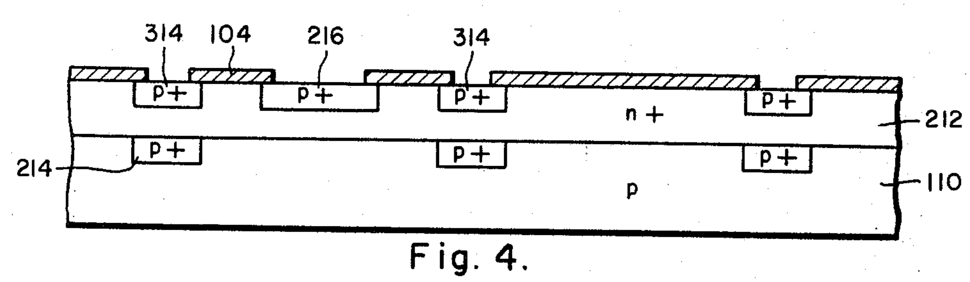
Figure 5:
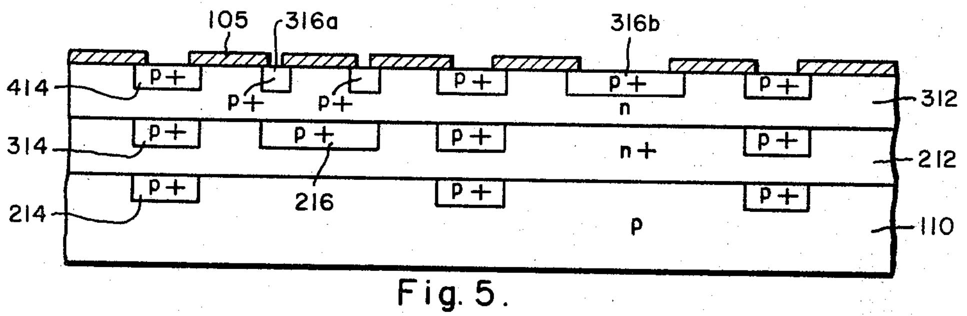

FIGURES 3, 4 and 5 illustrate steps in the fabrication process to make a structure like that shown in FIG. 2. On a p-type substrate 110, a first oxide mask 103 is formed with openings therein in the pattern desired for the location of the isolation wall 114. Within the openings in the oxide mask 103 is deposited a p-type impurity deposition 214.

In FIG. 4, the mask 103 has been removed and an epitaxial n-type layer 212 grown over the surface of the substrate 110 and the p-type deposition 214. Then a second oxide mask 104 is formed on the surface of the epitaxial layer 212. The oxide mask 104 has openings therein that coincide with the position of the p-type impurity deposition 214 and also an additional opening in a position for the diode anode region. Within these openings are deposited a p-type impurity forming the deposit 314 in a position for the isolation walls and the deposit 216 for the diode anode region.

The oxide mask 104 is removed and, as shown in FIG. 5, a second n-type epitaxial layer 312 is grown over the surface of the first epitaxial layer 212 and p-type depositions 314 and 216. As was discussed before, the epitaxial layer 312 may be, and preferably is, of higher resistivity than layer 212. On the surface of the second epitaxial layer 312 an oxide mask 105 is formed with openings therein in the desired position for the isolation wall 114 and also for the wall portion of the diode anode region and the base region of the transistor. Upon the deposition of p-type impurities within these openings are formed impurity deposits 414 for the isolation wall, 316*a* for the wall of the diode anode and **316*b*** for the transistor base region.

The impurity depositions 214, 314, 216, 414, **316*a* and 316*b*** are very shallow, highly doped regions of material and are referred to as depositions or deposits rather than as diffused regions because the impurities therein have not yet been diffused to the ultimately desired depth. It will be understood that some diffusion of impurities occurs during each stage of the process and the extent of diffusion is subject to control by time and temperature adjustment in accordance with known practice.

The p-type impurity deposits now in the structure are then driven or redistributed by heating to diffuse the impurity atoms so that the deposits 214, 314 and 414 join together and form the isolation wall 114 and the deposits **316*a* and 216 will diffuse together to form a pocket type diode anode region 116*a***.

Following the p-type diffusion, another oxide mask would be formed over the surface of the device with openings therein suitable for the deposition of the transistor emitter **118*b* and any n+ regions as may be desired such as in the n-type regions 112*a*, 112*b* or 118*a***. An n-type impurity would be deposited in such positions and diffused. An additional oxide mask would be formed with openings therein suitable for the deposition of the contacts desired on the semiconductive structure. The conductive material, such as aluminum, is evaporated and selectively removed such as by etching to form the desired contacts to the semiconductive material and interconnections extending over the oxide layer between elements of the integrated circuit. The structure is then heated to bond the conductors and may be packaged by known techniques.

The individual epitaxial growth, oxide masking, impurity deposition and diffusion operations suitable for use in the practice of present invention may be selected by those skilled in the art from those well known. For further examples of suitable materials and process techniques suitable for the fabrication of the structure, reference should be made to copending application Ser. No. 284,611, filed May 31, 1963, by H. C. Lin and assigned to the assignee of the present invention, now Patent 3,197,710, July 27, 1965.

The following example further illustrates the practice of the present invention.

A structure like that of FIG. 2 can be made with a substrate of p-type silicon having a resistivity of about 20 ohm-centimeters. Layer 112 is of a first portion (212 of FIG. 4) having an impurity concentration of about $10^{16}$ to $10^{17}$ atoms per cubic centimeter and a second portion (312 of FIG. 5) having an impurity concentration of about $10^{15}$ atoms per cubic centimeter. The layers 212 and 312 are epitaxially grown by the thermal reduction of silicon tetrachloride with hydrogen. The lower layer is doped with arsenic and the upper layer doped with phosphorus to provide the desired impurity concentrations.

The transistor base region **116*b* has a surface impurity concentration of about $10^{18}$ atoms per cubic centimeter and the transistor emitter region 118*b*** has a surface impurity concentration of about $10^{21}$ atoms per cubic centimeter. In the diode structure the bottom part of the p-type anode has an impurity concentration of about $10^{19}$ atoms per cubic centimeter while the anode wall has a surface impurity concentration of from about $10^{20}$ to $10^{21}$ atoms per cubic centimeter.

Figure 6:
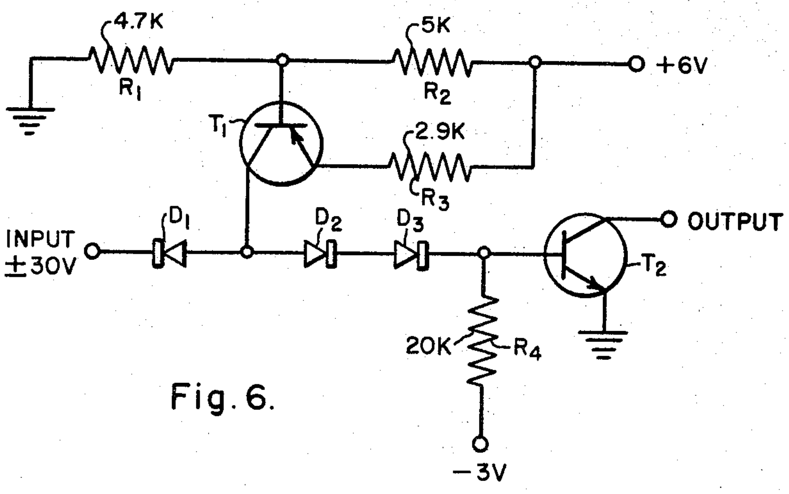
FIG. 6 is a schematic diagram of a circuit that may be advantageously incorporated into an integrated circuit in accordance with the present invention.

The circuit of FIG. 6 is an example of one that can be advantageously integrated in accordance with this invention. It is an input network intended for use as an input stage in logic circuits. The fabrication of the portion of the integrated circuit that follows the input diode $D_1$ can be performed in accordance with known techniques. Reference should be made to previously referred to copending application Ser. No. 284,611 for description of an integrated complementary pair of transistors for $T_1$ and $T_2$. It will be noted that the input voltage may swing from +30 volts to −30 volts. When the input is +30 volts the input diode $D_1$ is reversed biased and the anode of the diode is at about +1.8 volts. When the input is −30 volts, the diode is forward biased and the anode is at about −29.4 volts. If a positive supply voltage of +24 volts is available and is applied to the n-type epitaxial layer in the input diode portion for maintaining the junction with the substrate in a reverse bias, then this positive potential tends to promote transistor action in the diode structure. However, by using the diode structure in accordance with this invention there is little transistor action. Hence, anode current is merely equal to the cathode current and very little current can flow from the +24 volt supply.

While the present invention has been shown and described in a few forms only, it will be apparent that various changes and modifications may be made without departing from the spirit and scope thereof.

What is claimed is:

1. In a semiconductor integrated circuit, the structure comprising: a first portion for providing diode functions and a second portion for providing transistor functions; each of said portions comprising an isolated region of semiconductive material of a first type of semiconductivity; said first portion having a first region of second type semiconductivity therein that encloses and underlies a sub-portion of said isolated region so that the junction between said first region and said sub-portion is capable of operating as a diode junction having a relatively high breakdown voltage, the junction between the inner periphery of said first region and said sub-portion of said isolated region being greater than a carrier diffusion length from the junction at the outer periphery; said second portion having a second region of said second type that extends therein to approximately the same depth as said inner periphery of said first region and a third region of said first type disposed in said second region to form a transistor structure, said sub-portion of said isolated region having a lower impurity concentration than said third region.

2. In a semiconductor integrated circuit, the structure comprising: a substrate of a first type of semiconductivity; a layer of material of a second type of semiconductivity disposed on said substrate and forming a p-n junction therewith, said layer having a major surface remote from said substrate; an isolation wall extending through said layer from said major surface to said substrate, said wall separating first and second isolated regions of said layer; said first region having a third region of said first type therein extending from said major surface into said layer and enclosing and underlying a portion of said first region; said third region being greater than a carrier diffusion length in thickness; said second region having a fourth region of said first type therein extending into said layer approximately to the same depth as said portion of said first region; a fifth region of said second type disposed in said fourth region, said portion of said first region having a lower impurity concentration than said fifth region; means to make electrical contact to each of said third region, said portion of said first region and said second, fourth and fifth regions.

3. In an integrated circuit the structure comprising: a unitary body of semiconductive material including a first structural portion for providing diode functions and a second structural portion for providing transistor functions; each of said structural portions including three successive regions of semiconductive material of alternate semiconductivity type, the second region in said diode portion being greater than a carrier diffusion length in thickness between the first and third regions to inhibit transistor action; the first region in said diode portion having an impurity concentration substantially less than that of the first region in said transistor portion to provide a relatively high breakdown voltage of the junction between said first and second regions in said diode portion.

4. In an integrated circuit, the structure in accordance with claim 3 wherein: the second region in said diode portion has a thickness in the range from about 10 microns to about 20 microns and the first region in said diode portion has an impurity concentration in the range from $10^{14}$ to about $10^{16}$ atoms per cubic centimeter.

References Cited

UNITED STATES PATENTS

| | | | |
|---|---|---|---|
| 3,070,762 | 12/1962 | Evans | 333—70 |
| 3,100,276 | 8/1963 | Myer | 317—234 |
| 3,117,260 | 1/1964 | Noyce | 317—235 |
| 3,158,788 | 11/1964 | Last | 317—101 |
| 3,209,214 | 9/1965 | Murphy | 317—234 |
| 3,256,587 | 6/1966 | Hangstefer | 29—155.5 |

JOHN W. HUCKERT, *Primary Examiner.*

M. H. EDLOW, *Assistant Examiner.*